(12) United States Patent
Tang

(10) Patent No.: US 7,986,512 B2
(45) Date of Patent: Jul. 26, 2011

(54) ELECTRONIC DEVICE FRAME WITH SUPPORT MECHANISM

(75) Inventor: Zi-Ming Tang, Shenzhen (CN)

(73) Assignees: Hong Fun Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 112 days.

(21) Appl. No.: 12/560,517

(22) Filed: Sep. 16, 2009

(65) Prior Publication Data

US 2011/0007454 A1    Jan. 13, 2011

(51) Int. Cl.
*G06F 1/16* (2006.01)
(52) U.S. Cl. .................. 361/679.01; 349/58; 248/602
(58) Field of Classification Search ............. 361/679.01; 312/223.1; 248/602, 694, 560; 349/58, 59, 349/60
See application file for complete search history.

(56) References Cited

U.S. PATENT DOCUMENTS

| | | | | |
|---|---|---|---|---|
| 4,960,256 A | * | 10/1990 | Chihara et al. | 248/286.1 |
| 5,028,913 A | * | 7/1991 | Kitamura | 361/679.27 |
| 6,504,707 B2 | * | 1/2003 | Agata et al. | 361/679.05 |
| 6,822,871 B2 | * | 11/2004 | Lee et al. | 361/727 |
| 7,157,648 B2 | * | 1/2007 | Park | 174/481 |
| 7,159,828 B1 | * | 1/2007 | Yau et al. | 248/125.8 |
| 2003/0081996 A1 | * | 5/2003 | Sun et al. | 403/381 |
| 2007/0091555 A1 | * | 4/2007 | Lee | 361/683 |
| 2008/0029663 A1 | * | 2/2008 | Derry et al. | 248/178.1 |
| 2009/0029748 A1 | * | 1/2009 | Lee | 455/575.4 |
| 2009/0168339 A1 | * | 7/2009 | Lee | 361/679.56 |
| 2009/0231785 A1 | * | 9/2009 | Li et al. | 361/679.01 |
| 2011/0002091 A1 | * | 1/2011 | Tang | 361/679.01 |
| 2011/0006647 A1 | * | 1/2011 | Wang et al. | 312/223.1 |

* cited by examiner

*Primary Examiner* — Lisa Lea-Edmonds
(74) *Attorney, Agent, or Firm* — Zhigang Ma

(57) ABSTRACT

An electronic device includes a housing, a positioning member connecting with the housing, and an inner supporting mechanism. The inner supporting mechanism includes a support member fixed on the housing, a slider slidably connected to the support member, and an adjustment member connecting the support member to the slider. The adjustment member adjusts a distance between the slider and the support member, such that the slider maintains resistance of the positioning member by sliding relative to the support member.

15 Claims, 4 Drawing Sheets

ELECTRONIC DEVICE FRAME WITH SUPPORT MECHANISM

BACKGROUND

1. Technical Field

The present disclosure relates generally to electronic devices and, more particularly, to an electronic device frame with an adjustable support mechanism.

2. Description of Related Art

An electronic device, such as a flat panel display, often has a back housing and a front bezel positioned on the back housing. If the size and thickness of the flat panel display are increased, a middle portion of the front bezel is easily bent, such that the flat panel display generally has an inner support mechanism to support the front bezel.

A typical used support mechanism of the flat panel display includes two support bases and a plurality of support bars. The support bases are fixed on opposite ends of the back housing, and horizontally positioned on the support bases and abut the front bezel. However, the typical support mechanism has a complex structure, and a height of the support mechanism cannot be changed.

Therefore, there is room for improvement within the art.

BRIEF DESCRIPTION OF THE DRAWINGS

The components in the drawings are not necessarily drawn to scale, the emphasis instead being placed upon clearly illustrating the principles of the present disclosure. Moreover, in the drawings, like reference numerals designate corresponding parts throughout several views, and all the views are schematic.

DETAILED DESCRIPTION

Figure 1:
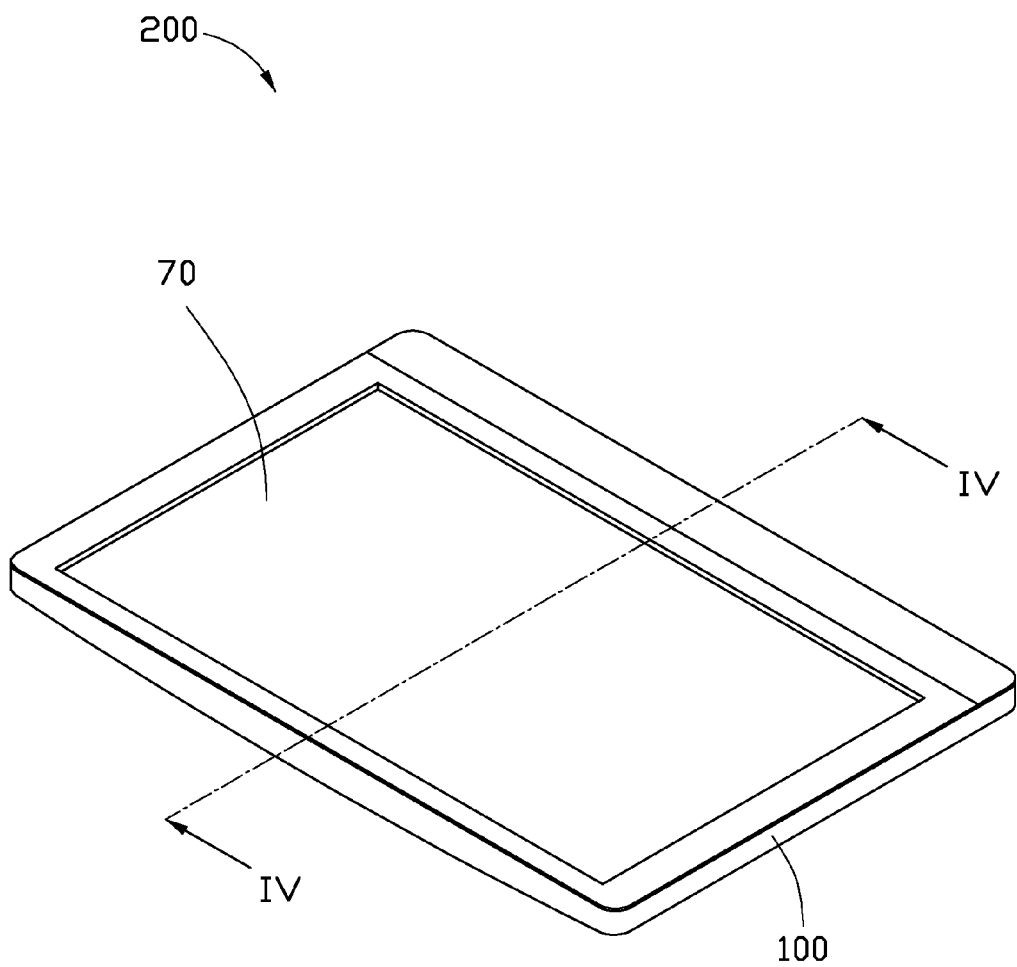
FIG. 1 is an isometric view of an embodiment of an electronic device, the electronic device including a frame and a display body.
Figure 2:
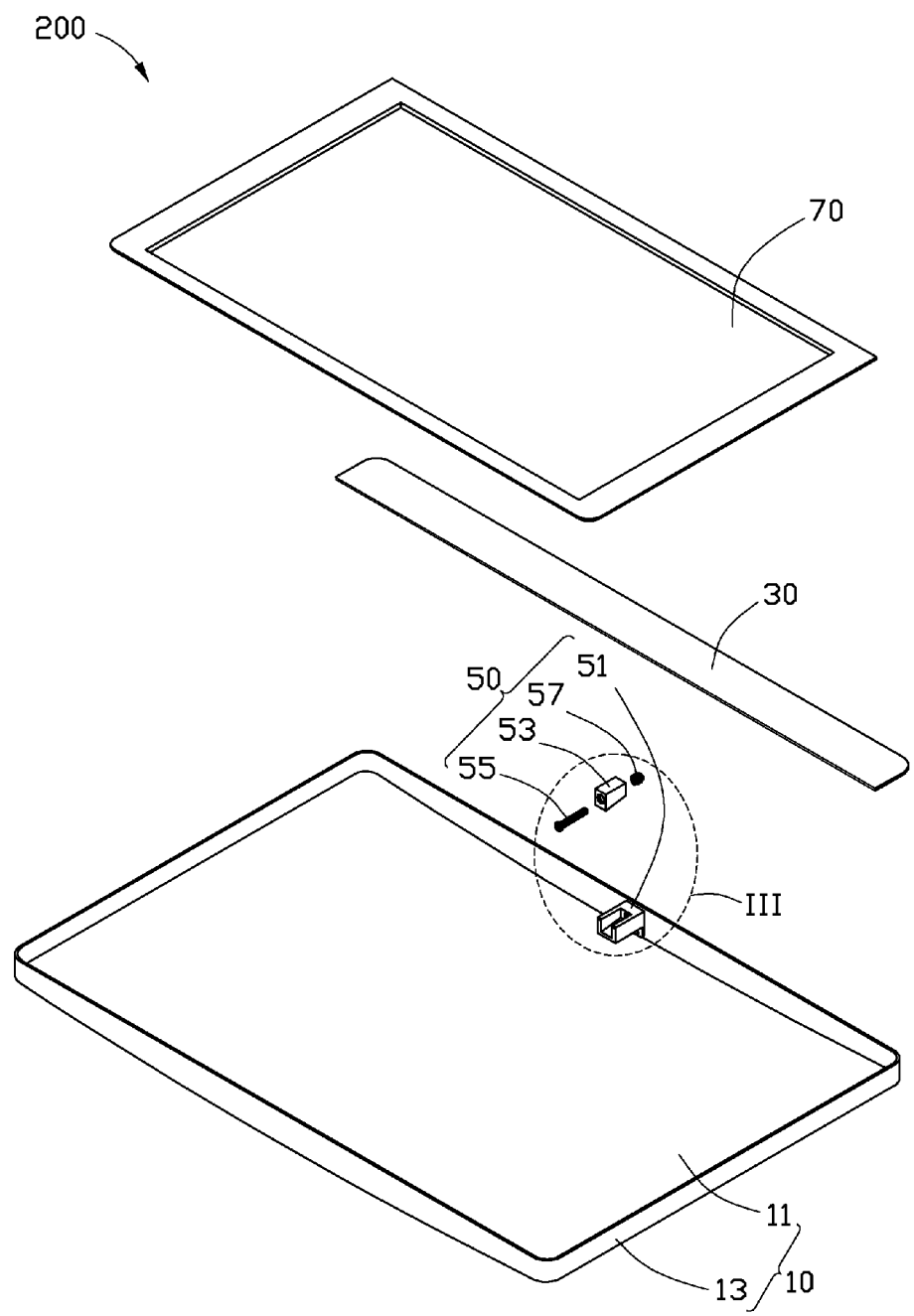
FIG. 2 is an exploded, isometric view of the electronic device of FIG. 1.

Referring to FIG. 1 and FIG. 2, an embodiment of an electronic device 200 includes a frame 100 and a display body 70 fixed to the frame 100. The frame 100 includes a housing 10, a positioning member 30, and one or more inner support mechanisms 50. The support mechanism 50 is positioned between the housing 10 and the positioning member 30. The display body 70 is positioned on the housing 10, and connected to the positioning member 30. In the illustrated embodiment, the electronic device 200 is a flat panel display, and the frame 100 is part of the flat panel display 200 and has one inner support mechanism 50.

Referring to FIGS. 1 and 2, the housing 10 includes a base plate 11 and a sidewall 13 extending from an edge of the base plate 11. The positioning member 30 is fixed to a top end of the sidewall 13.

Figure 3:
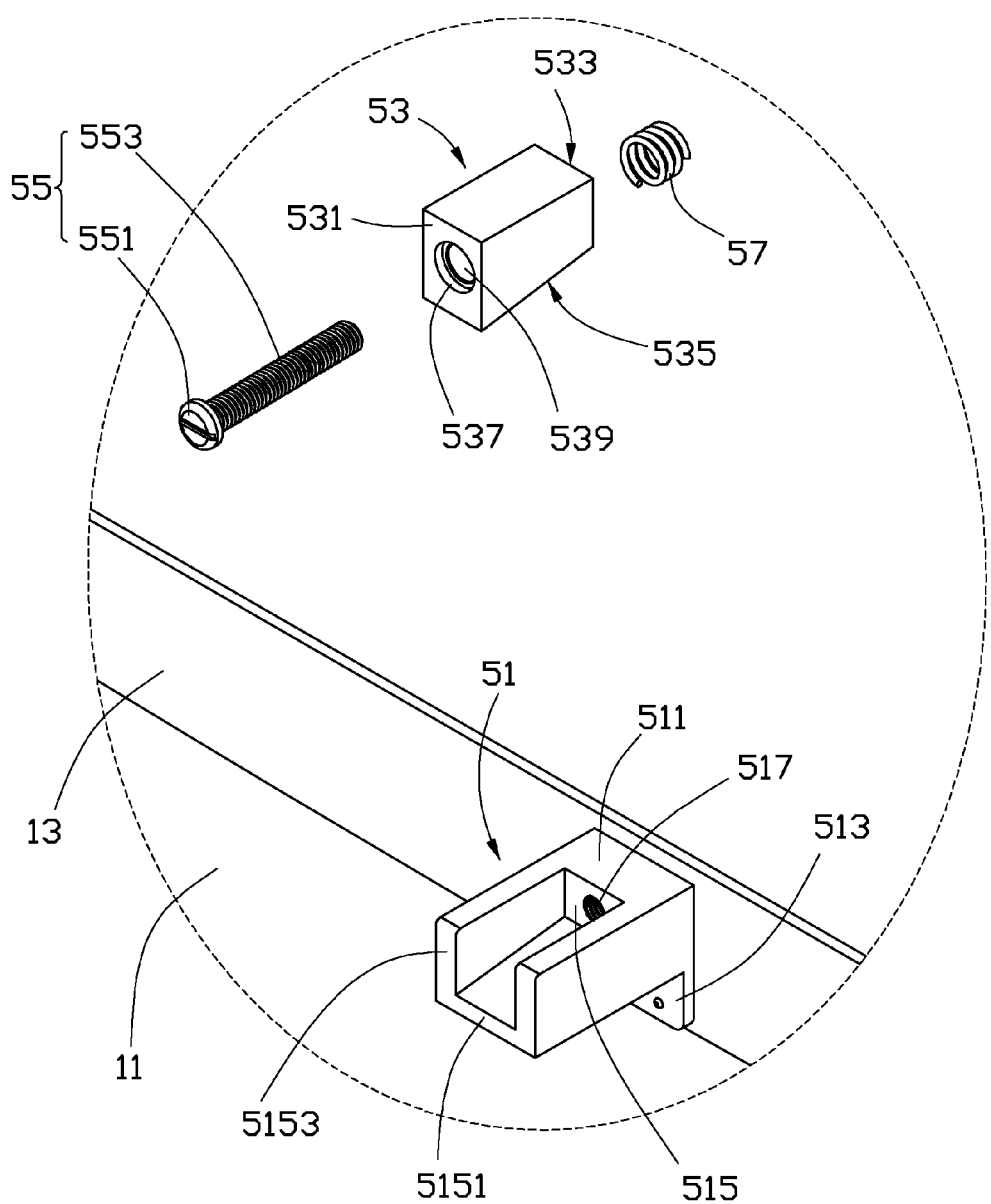
FIG. 3 is an enlarged view of part III of FIG. 2.

Referring to FIGS. 2 and 3, the support mechanism 50 includes a support member 51, a slider 53, an adjustment member 55, and an elastic member 57. The slider 53 is partially received in the support member 51 and resists the positioning member 30. The adjustment member 55 connects the support member 51 to the slider 53. The elastic member 57 resists the support member 51 and the slider 53.

The support member 51 includes a support body 511 and a connecting plate 513 extending from the edge of the support body 511. The support body 511 defines a receiving portion 515 receiving the slider 53. The receiving portion 515 includes a base wall 5151 and a sidewall 5153 extending substantially perpendicularly from one edge of the base wall 5151, wherein the base wall 5151 is angled. The sidewall 5153 defines a fixing hole 517. The support member 51 can be fixed to the sidewall 13 of the housing 10 by welding, gluing, or fasteners.

Figure 4:
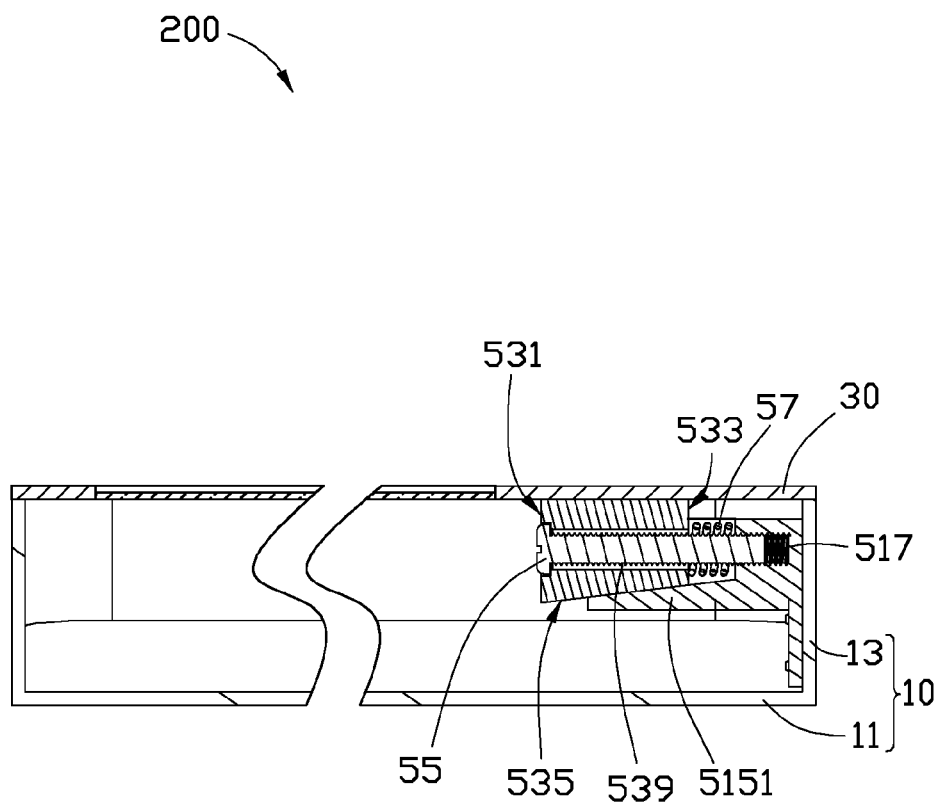
FIG. 4 is a cross-section of the electronic device of FIG. 1 taken along line IV-IV.

Referring to FIGS. 3 and 4, the slider 53 includes a first end surface 531, a second end surface 533, and an inclined sliding surface 535 connecting the first end surface 531 to the second end surface 533. The slider 53 defines a receiving hole 537 substantially coaxial to the fixing hole 517 of the support member 51 and a connecting hole 539 substantially coaxial to and communicating with the receiving hole 537. The diameter of the receiving hole 537 exceeds that of the connecting hole 539. The sliding surface 535 contacts the base wall 5151 of the support member 51, so that distance between the slider 53 and the base plate 11 can be adjusted by the slider 53.

The adjustment member 55 includes a head portion 551 and a shaft 553 extending from one end surface of the head portion 551. The shaft 553 is a threaded portion. The diameter of the shaft 553 is smaller than the connecting hole 539 of the slider 53, so that no friction occurs between the slider 53 and the adjustment member 55.

In the illustrated embodiment, the elastic member 57 is a compression spring. The elastic member 57 is received in the receiving portion 515 of the support member 51, sleeved on the shaft 553 of the adjustment member 55, and resists the sidewall 5153 of the support member 51 and the second end surface 533 of the slider 53.

During assembly of the frame 100, the support member 51 is fixed to a middle portion of a side of the base plate 11. The elastic member 57 and the slider 53 are positioned in the receiving portion 515 of the support member 51. The shaft 553 of the adjustment member 55 extends through the receiving hole 537 of the slider 53, the connecting hole 539 of the slider 53, the elastic member 57, and threads in the fixing hole 517 of the support member 51. The head portion 551 of the adjustment member 55 is received in the receiving hole 537 of the slider 53. The positioning member 30 is fixed to the top end of the sidewall 13 of the housing 10.

The adjustment member 55 can be rotated to release the slider 53 if there is a clearance between the slider 53 and the positioning member 30, so that the slider 53 can slide in the receiving portion 515. When the slider 53 resists the positioning member 30, the slider 53 is fixed again by the adjustment member 55. The display body 70 is connected to the positioning member 30.

The support mechanism 50 includes the support member 51 and the slider 53 fastened thereto. Therefore, the support mechanism 50 has a simplified structure. In addition, the sliding surface 535 of the slider 53 and the base wall 5151 of the support member 51 is angled with the positioning member 30, and distance between the slider 53 and the base plate 11 is adjustable such that positioning member 30 is always firmly supported by the support mechanism 50. The elastic member 57 resists the support member 51 and the slider 53 to firmly maintain the position of the slider 53 on the support member 51.

It should be pointed out that the frame 100 may include more than one support mechanism 50, arrayed on the base plate 11 appropriately.

Finally, while various embodiments have been described and illustrated, the disclosure is not to be construed as being limited thereto. Various modifications can be made to the embodiments by those skilled in the art without departing from the true spirit and scope of the disclosure as defined by the appended claims.

What is claimed is:

1. An electronic device frame, comprising:
   a housing;
   a positioning member fixed to the housing; and
   an inner support mechanism comprising a support member, a slider, and an adjustment member connecting the slider to the support member, wherein the support member is fixed to one of the housing or the positioning member, and the slider is slidably connected to the support member to maintain resistance on the other one of the housing or positioning member.

2. The electronic device frame of claim 1, wherein the support member comprises a support body and a receiving portion defined in the support body;
   the slider is partially received in the receiving portion.

3. The electronic device frame of claim 2, wherein the slider defines a connecting hole; the support body defines a fixing hole substantially coaxial to the connecting hole; the adjustment member extends through the connecting hole of the slider and engages in the fixing hole of the support body.

4. The electronic device frame of claim 3, wherein the adjustment member comprises a head portion and a shaft extending from one end surface of the head portion; the slider further defines a receiving hole substantially coaxial to the connecting hole; the head portion is received in the receiving hole, and the shaft is partially received in the connecting hole.

5. The electronic device frame of claim 4, wherein a diameter of the shaft is smaller than a diameter of the connecting hole of the slider.

6. The electronic device frame of claim 5, wherein the shaft of the adjustment member is threaded, and the fixing hole of the support member is threaded.

7. The electronic device frame of claim 2, wherein the receiving portion of the support member comprises a base wall angled with the positioning member; the slider comprises a slider surface contacting the base wall.

8. The electronic device frame of claim 1, wherein the support member is fixed to the housing.

9. The electronic device frame of claim 1, further comprising an elastic member sleeved on the shaft of the adjustment member, and resisting the support member and the slider.

10. The electronic device frame of claim 9, wherein the elastic member is a compression spring.

11. The electronic device frame of claim 1, wherein the housing comprises a base plate, and a sidewall extending from an edge of the base plate; the positioning member is fixed to the sidewall.

12. The electronic device frame of claim 1, wherein the electronic device comprises a display body positioned on the housing, and connected to the positioning member.

13. A support mechanism, comprising:
    a support member;
    a slider slidably connected to the support member;
    an adjustment member connecting the slider to the support member; and
    an elastic member sleeved on the adjustment member, resisting the support member and the slider, wherein the support member comprises a support body and a receiving portion defined in the support body; the slider is partially received in the receiving portion; the slider defines a connecting hole; the support body defines a fixing hole substantially coaxial to the connecting hole; the adjustment member extends through the connecting hole of the slider and engages in the fixing hole of the support body.

14. The support mechanism of claim 13, wherein the adjustment member comprises a head portion and a shaft extending from one end surface of the head portion; the slider further defines a receiving hole substantially coaxial to the connecting hole; the head portion is received in the receiving hole, the shaft is partially received in the connecting hole.

15. The support mechanism of claim 14, wherein a diameter of the shaft is smaller than a diameter of the connecting hole of the slider.

* * * * *

UNITED STATES PATENT AND TRADEMARK OFFICE
CERTIFICATE OF CORRECTION

PATENT NO. : 7,986,512 B2  Page 1 of 1
APPLICATION NO. : 12/560517
DATED : July 26, 2011
INVENTOR(S) : Zi-Ming Tang It is certified that error appears in the above-identified patent and that said Letters Patent is hereby corrected as shown below:

Title Page
Please replace Section (73) regarding "Assignees" with the following:

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW).

Signed and Sealed this
Twenty-second Day of November, 2011

David J. Kappos
*Director of the United States Patent and Trademark Office*